United States Patent [19]
Glass et al.

[11] Patent Number: 6,037,890
[45] Date of Patent: Mar. 14, 2000

[54] ULTRA HIGH SPEED, LOW POWER, FLASH A/D CONVERTER UTILIZING A CURRENT MODE REGENERATIVE COMPARATOR

[75] Inventors: Kevin W. Glass, Scottsdale; Waleed Khalil, Tempe; Bart R. McDaniel, Phoenix, all of Ariz.

[73] Assignee: Intel Corporation, Santa Clara, Calif.

[21] Appl. No.: 08/940,159

[22] Filed: Sep. 30, 1997

[51] Int. Cl.[7] .................................................. H03M 1/36
[52] U.S. Cl. .......................................... 341/159; 341/155
[58] Field of Search .................................... 341/156, 159, 341/162, 110, 139, 200, 158, 155

[56] References Cited

U.S. PATENT DOCUMENTS

| | | | |
|---|---|---|---|
| 3,721,975 | 3/1973 | Brinkman et al. ....................... | 341/156 |
| 5,283,582 | 2/1994 | Krenik ..................................... | 341/158 |
| 5,579,006 | 11/1996 | Hasegawa et al. ...................... | 341/162 |

OTHER PUBLICATIONS

IEEE Journal of Solid–State Circuits, vol. 29, No. 8, Aug. 1994—Hooman Reyhani and Philip Quinlan entitled "A5V, 6–b,80 Ms/s BiCMOS Flash ADC".

Electronics Letters 11th May 1989 vol. 25 No. 10, p. 675–676, entitled "CMOS Variable Transconductance Circuit With Constant Bandwitdth."

ISSCC95/Session 5/Disk and Arithmetic Signal Processors/Paper WP 5.4—Masanori Izumikawa, Hlroyuki Igura, Kolchiro Furuta, Hiroshi Ito, Hitoshi Wakabayashi, Ken Nakajima, Tohru Mogami, Tadahiko Horluchl, Masakazu Yamashina—entitled "WP 5.4: A 0.9V 100MHz 4mW $2mm^2$16b DSP Core"—NEC Corporation, Kanagawa, Japan.

*Primary Examiner*—Michael Tokar
*Assistant Examiner*—Patrick Wamsley
*Attorney, Agent, or Firm*—Blakely, Sokoloff, Taylor & Zafman LLP

[57] ABSTRACT

A method and apparatus for performing analog to digital conversion. A voltage to current converter converts an analog input voltage to an input current. A current reference generates a reference current. A plurality of scaling elements scaled the reference current to yield a plurality of scaled reference currents each corresponding to some voltage level within the dynamic range of the input voltage. The input current is compared to each of the scaled reference currents in a plurality of current comparators to generate a thermometer code from which a digital representation of the analog input voltage is derived.

9 Claims, 6 Drawing Sheets

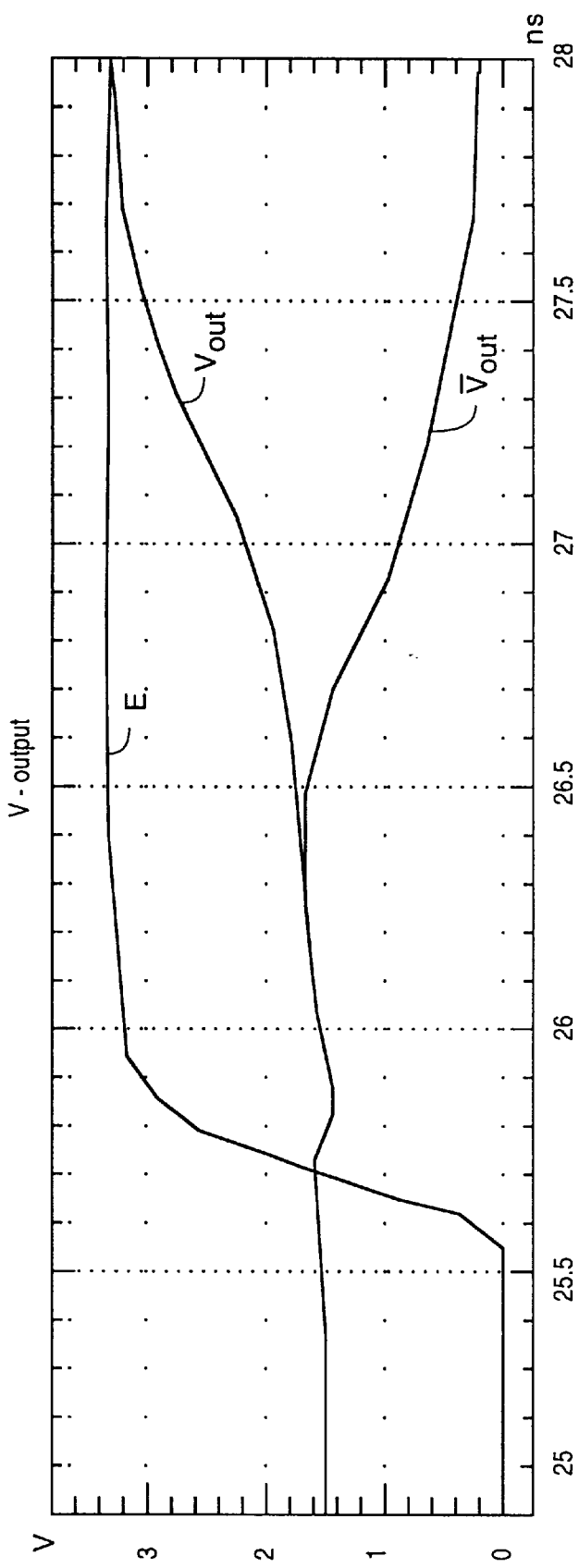

ULTRA HIGH SPEED, LOW POWER, FLASH A/D CONVERTER UTILIZING A CURRENT MODE REGENERATIVE COMPARATOR

BACKGROUND OF THE INVENTION (1) Field of the Invention

The invention relates to high speed, low power circuits. More specifically, the invention relates to a high speed, low power analog to digital converter employing a current regenerative comparator.

(2) Related Art

Converting analog signals to digital signals is generally well-known in the art. The fastest general analog to digital (A/D) conversion method has been flash conversion in which the sample signal is compared simultaneously (in parallel) to several reference signals to generate a thermometer code that can be encoded into a digital value. Flash A/D has historically been limited in use because it requires a large area, high power, and it is difficult to build accurate, multiple voltage references. Prior art flash A/D converters are implemented with comparators built from differential amplifiers. Differential amplifiers require large DC currents in order to have high speed. Maintaining proper bias over a variable voltage supply is also a problem in conjunction with operation at low supply voltages. The prior art flash A/D converters typically created the multiple voltage references on one side of the differential pair with a single voltage reference and a resistive ladder. CMOS fabrication techniques are well developed and relatively inexpensive. Moreover, CMOS circuitry permits high speed operation. Unfortunately, high quality resistors are not available in advanced CMOS digital processes. Accordingly, manufacturing high quality A/D using digital CMOS processes has been largely impossible.

The speed at which conversions can be made is very important since the higher frequency at which the A/D conversion can be performed, the wider the bandwidths that can be handled. This becomes increasingly important in video and audio applications. Moreover, small portable devices relying on A/D conversion have become increasingly common. The high power and large area of the previous flash implementations are unsuitable for portable battery operated applications. In any event, it is desirable to reduce the space and power consumption in A/D converters.

In view of the foregoing, it would be desirable to create a high-speed, low power analog to digital converter which can be wholly fabricated using CMOS digital processes. High Speed A/Ds using CMOS digital processes would permit integration of the A/D with microprocessors which can then serve high performance applications.

BRIEF SUMMARY OF THE INVENTION

A method and apparatus for performing analog to digital conversion is disclosed. A voltage to current converter converts an analog input voltage to an input current. A current reference generates a reference current. A plurality of scaling elements scale the reference current to yield a plurality of scaled reference currents each corresponding to some voltage level within the dynamic range of the input voltage. The input current is compared to each of the scaled reference currents in a plurality of current comparators to generate a thermometer code from which a digital representation of the analog input voltage is derived.

BRIEF DESCRIPTION OF THE DRAWINGS

FIGS. 3a–c are graphs of the current and voltage response of the comparator circuit of FIG. 2.

DETAILED DESCRIPTION OF THE INVENTION

Figure 1:
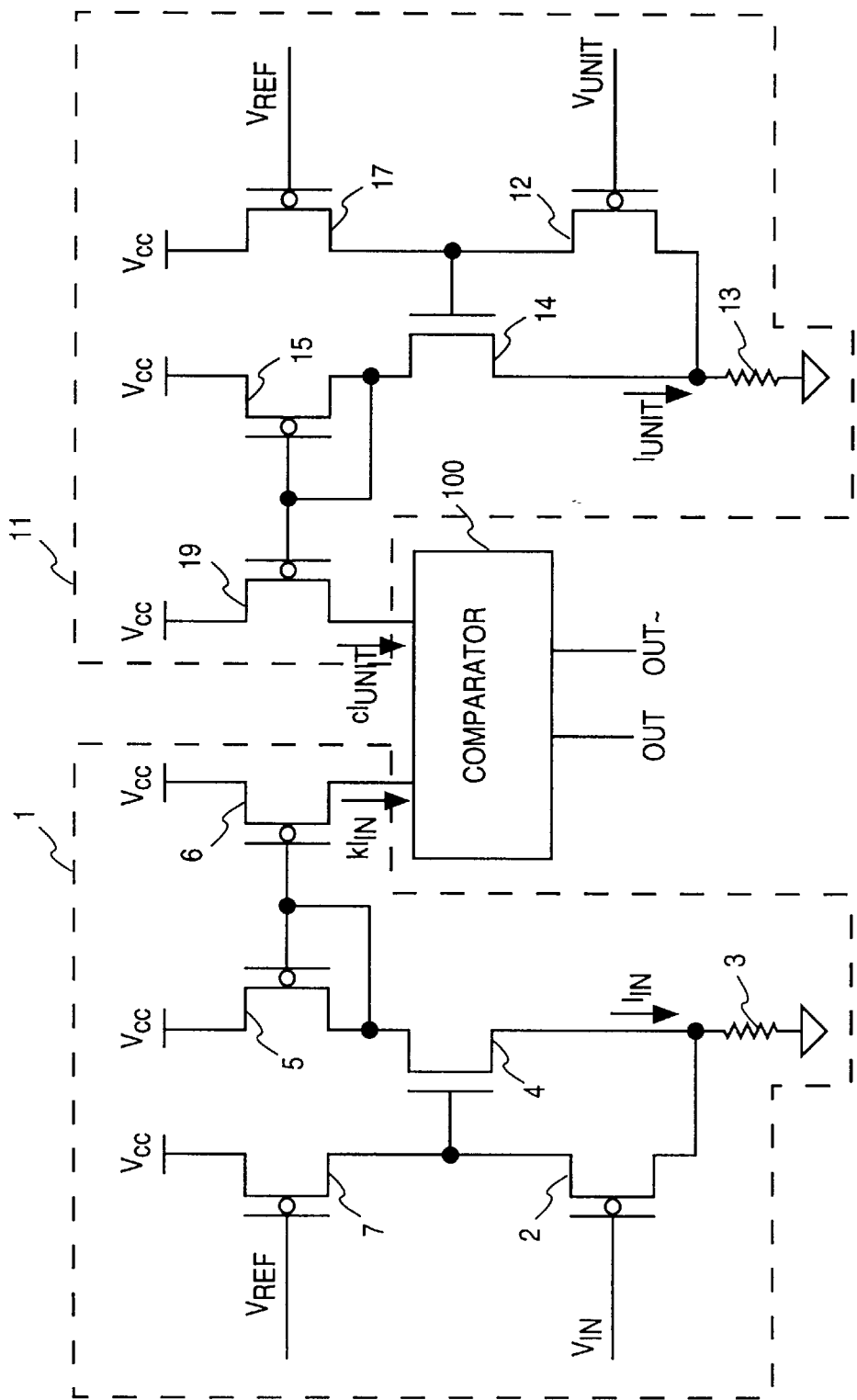
FIG. 1 is a schematic of a voltage to current converter employed in one embodiment of the invention.

FIG. 1 is a schematic of a voltage to current converter employed in one embodiment of the invention. An input voltage to current converter 1 converts an incoming voltage $V_{IN}$ to a current $I_{IN}$ scaled by a constant k. The constant k is dictated by characteristics of current source transistor 6. The voltage $V_{IN}$ is applied to the gate of a p-transistor 2. The drain of transistor 2 is coupled to one end of resistor 3, the other end of which is coupled to ground. $V_{REF}$ is a voltage equal to the top of a dynamic range in which $V_{IN}$ might vary. $V_{REF}$ is applied to the gate of a p-type reference transistor 7. The drain of reference transistor 7 is coupled to the source of input transistor 2 and the gate of n-transistor 4. The source of the reference transistor 7 is coupled to the power supply voltage $V_{cc}$. One of ordinary skill in the art will recognize that the transistors are symmetric and, therefore, the designation of source and drain is arbitrary and will change depending on the voltages applied. Use of source or drain in this application is for reference only.

A current mirror comprising p-type transistors 5 and 6 mirrors the current $I_{IN}$ flowing through resistor 3. $I_{IN}$ is the sum of resistor current and transistor 2 current. Resistor 3 is a well resistance. Transistor 6 can be selected to scale $I_{IN}$ by a constant k. Thus, if small input currents are expected scaling up the current $kI_{IN}$ by, e.g., a factor of two or four, may permit easier comparison in comparator 100 (detailed further with reference to FIG. 2 below). A second voltage to current converter 11 is used to generate a unit current and/or multiples thereof. Resistor 13 through which the unit current flows is also a well resistance and should be approximately identical to resistor 3. This can be accomplished by making voltage to current converter 11 a replicate of voltage to current converter 1. Accordingly, the transistors 12, 14, 15, and 17 should be replicates of 2, 4, 5, and 7. Transistor 19, a current source transistor of voltage to current converter 11, is selected to provide a particular multiple of the unit current for purposes of comparison. As will be discussed more fully below, a plurality of transistors are employed to provide comparison at each unit division within the dynamic range.

Figure 2:
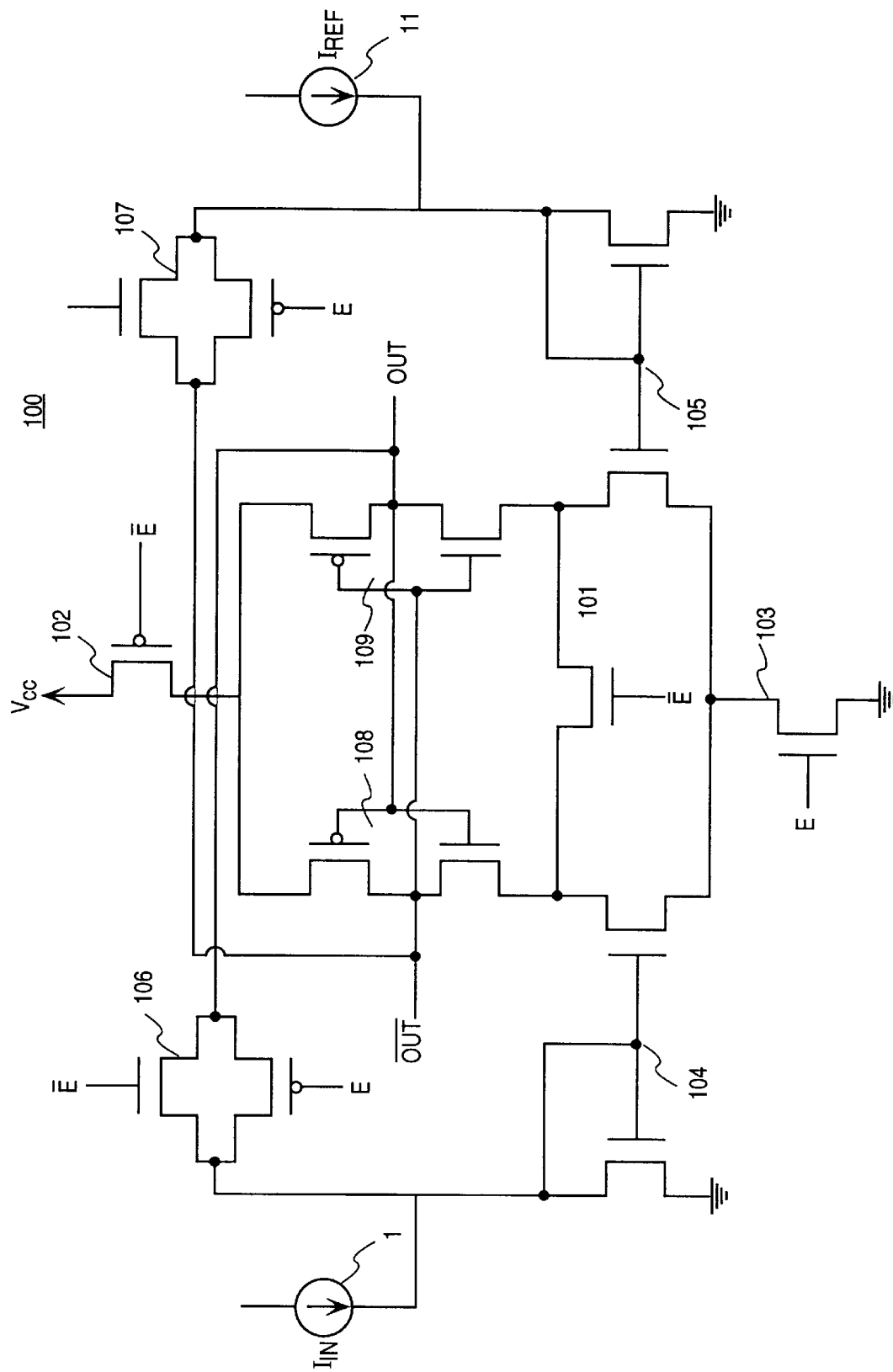
FIG. 2 is a schematic of a current regenerative comparator of one embodiment of the invention.

FIG. 2 shows a schematic of a current regenerative comparator of one embodiment of the invention. A pair of cross-coupled push-pull CMOS inverters 108, 109 form the basis for the current regenerative comparator 100. The positive power supply is coupled to these inverters through a p-transistor 102. The gate of P-transistor 102 is coupled to the inverse of the enable line. Thus, when the circuit is clocked, e.g., enable is asserted, a first isolation transistor 102 turns on and sources $V_{cc}$ to the comparator circuit. Similarly, a second isolation transistor 103 provides a path to ground when enable is asserted. An n-transistor 101 couples together the sources of the n-transistors of push-pull inverters 108, 109 when enable is not asserted because the inverse of the enable signal is applied to the gate of the n-transistor 101 when the enable is asserted. This coupling between the drains effectively becomes a short circuit. In this way, the n-transistor 101 insures that the source nodes of the n-transistors of the inverters 108, 109 are maintained at the same voltage before enable is asserted. Accordingly, before enable is asserted, the $V_{GS}$ of the n-transistors of the inverters 108, 109 is held the same.

The pair of current mirrors 104 and 105 mirror incoming currents $I_{IN}$ and $I_{REF}$, respectively. $I_{IN}$ and $I_{REF}$ are also applied to the sources of transfer gates 106 and 107.

The enable signal is applied to the gate of each of the p-transistor of the transfer gates 106, 107 while the inverse of the enable is applied to the gate of the n-transistor of each transfer gate 106, 107. Thus, until enable is asserted, the voltage at the source of each transfer gate 106, 107 appears at its drain. This has the effect of nudging the output of the comparator 100 in the direction which it will ultimately resolve the comparison.

For example, if $I_{REF}$ is greater than $I_{IN}$, transfer gate 107 will cause a greater voltage to appear at the gate of cross-coupled inverter 109, while transfer gate 106 causes a lower voltage to appear at the gate of cross-coupled inverter 108. This voltage difference preconditions the cross-couple inverters 108, 109 to respond as expected when the enable signal is asserted. In this example, when enable is asserted, the voltage $V_{cc}$ will appear at the drain of the p-transistor of cross-coupled inverter 108 which is coupled to the gates of the inverter 109, thereby shutting off the p-transistor and turning on the n-transistor of that inverter 109. Thus, the lower voltage rail, in this case, ground, appears at the output OUT and $V_{cc}$ appears at the output $\overline{OUT}$. This is as expected since a comparison in which the reference current is higher than the input current should result in a zero in the thermometer code.

Figure 3A:
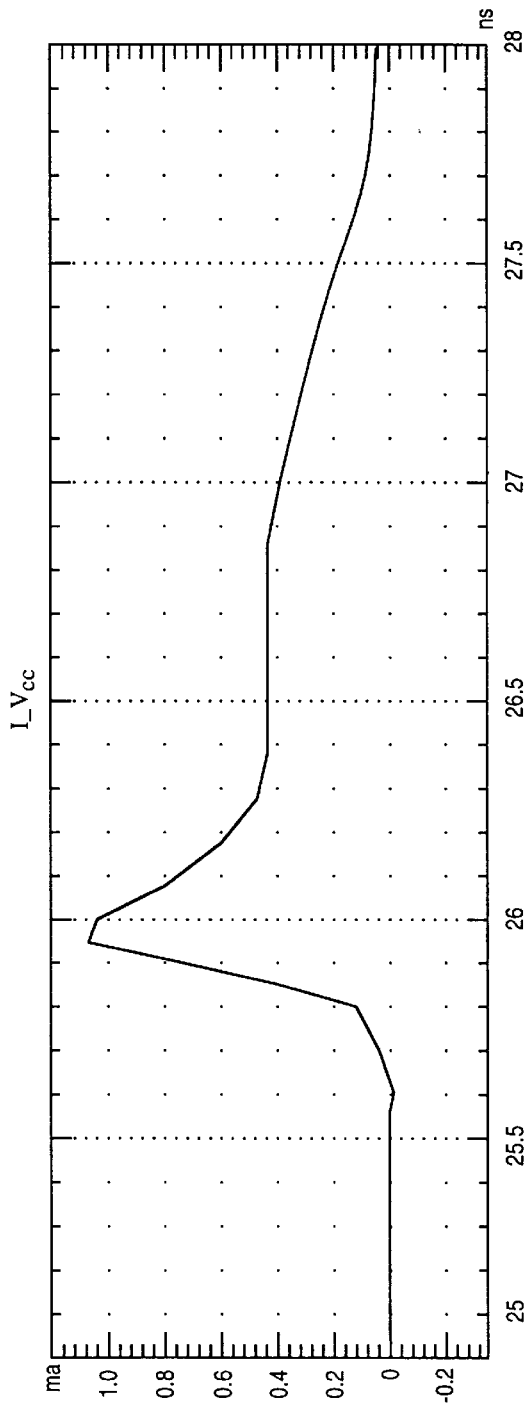
Figure 3B:
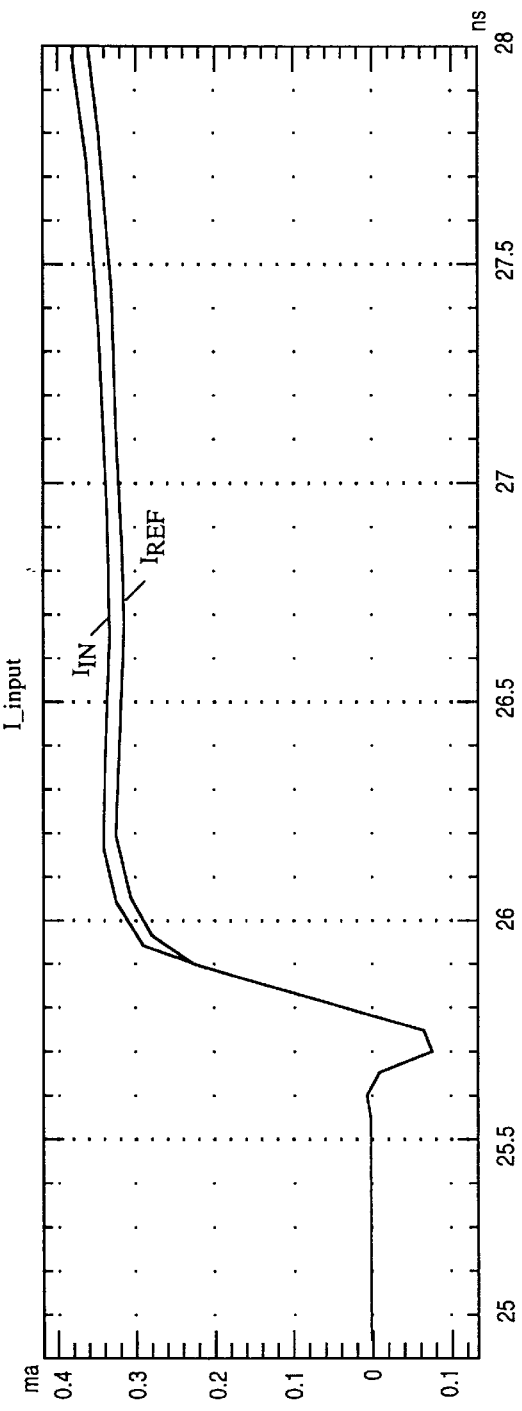

FIGS. 3a–c show graphs of the current and voltage response of the comparator circuit of FIG. 2. The power consumption characteristics of this comparator 100 causes the A/D converter employing it to have significantly lower average power requirements than existing A/D converters. FIG. 3a shows the current flowing from the power supply in the comparator 100. Significantly, the only time current flows in the circuit is during the actual comparison. Once the outputs resolve to the voltage rails, the current in the circuit dies out. However, when averaged over time, a marked decrease in power consumption is realized over that of prior art A/D converters in which differential amplifiers require large constant currents to operate.

FIG. 3b shows the difference in $I_{IN}$ and $I_{REF}$ for one sampling. As shown in FIG. 3c, even in the case of current differences on the order of 10 μA, the comparator resolves to the voltage rails in only about 3 ns.

Additionally, once a sample is taken, the resolution to the voltage rail is effectively latched until the next enable pulse. As a result, in one embodiment, the sample and hold stages typical of prior art A/D converters is eliminated.

Figure 4:
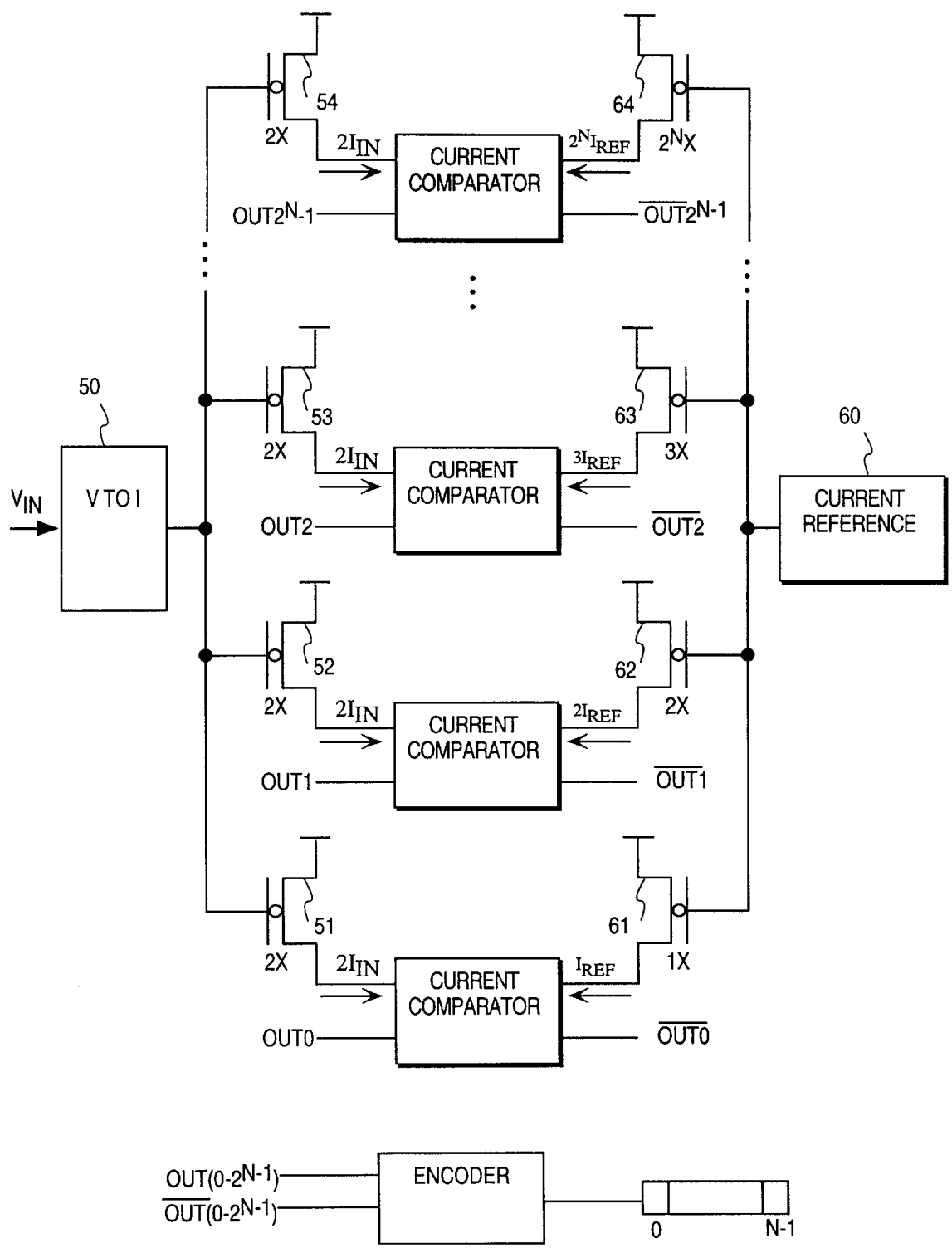
FIG. 4 is a block diagram of an Analog to Digital (A/D) converter of one embodiment of the invention.

FIG. 4 shows a block diagram of an Analog to Digital (A/D) converter of one embodiment of the invention. An analog input voltage $V_{IN}$ is applied to a voltage to current converter (V/I 50). V/I converter may be the circuit of FIG. 1 or it may be another V/I converter such as those described in "CMOS Variable Transconductance Circuit with Constant Bandwidth" by E. Klumperink, et al., ELECTRONICS LETTERS, May 11, 1989, vol. 5, no. 10. $V_{IN}$ can vary between some minimum and some maximum voltage. The range between the minimum and maximum voltage over which $V_{IN}$ may vary is known as the dynamic range. A reference voltage $V_{REF}$ is also applied to the V/I converter 50. $V_{REF}$ is selected to be the maximum voltage of the dynamic range. From $V_{IN}$, a current $I_{IN}$ which may be scaled by some constant k is generated. Mirroring transistors 51–54 both mirror the current $I_{IN}$ and perform the scaling. The scaled current, $kI_{IN}$, is applied to one input of a plurality of comparators 100.

The other input of comparator 100 is supplied by a current reference 60, the current of which is mirrored through mirroring transistors 61–64. Each mirroring transistor 61–64 supplies the input to one comparator, and each mirroring transistor 61–64 has its own scale factor. Current reference 60 may be a replicate of the V/I converter as shown in FIG. 1. The advantage to replicate is that distortion in the V/I converter 50 and current reference 60 then becomes common mode and does not effect the comparison. Alternatively, the reference need only guarantee to output a known reference current, and the mirroring transistor can be used to scale that reference for appropriate comparison. Certain band gap references known in the art are suitable for generating the value for $V_{REF}$.

In one embodiment, the number of comparators 100 is equal to $2^N$, where N is the number of digital bits of output desired. Thus, for a 6-bit digital output, sixty-four comparators 100 would be used. A scaled input current is applied to each of the comparators simultaneously. Typically, each comparator is a replicate of each other comparator. However, in some cases, it may be desirable or necessary to adjust the bias point at which the circuit operates. The bias point of any particular comparator can be changed by manipulating the size of the diode connected transistors of the input and reference current mirrors.

The current reference generator 60 may be in conjunction with mirroring transistors 61–64 providing $2^N$ scale factors to generate $2^N$ multiples of the unit current. This permits $2^N$ levels of comparison. The unit current is created by dividing the dynamic range by $2^N$. Thus, if we assume that the dynamic range is between 0 and 1 volt (e.g., a dynamic range of 1 volt), a unit current corresponds to ¹⁄₆₄th of a volt.

The $2^N$ comparators 100 output a thermometer code because at every point until $cI_{UNIT}$ $kI_{IN}$, the output of the comparator will be 1, and at every point above that, the output of the comparator will be 0. One of ordinary skill in the art will recognize that it is a trivial matter to take the inverse of the output and use that to arrive at a digital value. A thermometer code passes into an encoder 200 which converts the thermometer code to digital. Such encoding techniques are well known in the art. The result is a digital value 201 having N bits. In one embodiment, the comparators 100 output both a result of the comparison and its inverse. In this embodiment, either or both may be used at no additional cost to generate the digital value.

In another embodiment, the input mirroring transistors 51–54 have variable scaling, e.g., transistor 51 may scale by two or four, while transistor 54 may scale by one. This variable scaling of the input side should be reflected in a downward scaling on the reference side such that the ratio between the sides remains the same. This permits fewer different reference mirroring transistors. For example, if N=4, S implies sixteen comparators. If the high order mirroring transistors on the input side scale by one and the lower order eight mirroring transistors scale by two, only eight different current levels are required on the reference side. This is true because a comparison of $I_{IN}$ to $8I_{REF}$ should yield the same result as comparing $2I_{IN}$ to $16I_{REF}$.

In another embodiment, subranging is used to reduce the number of comparators required. For example, assuming a four bit digital output is required (e.g., N=4) in the first described embodiment, the sixteen comparators would be required. However, with subranging the number of comparators may, e.g., be reduced to four implying four subranges. A first comparison compares $kI_{IN}$ with each of $I_{UNIT}$, $2I_{UNIT}$, $4I_{UNIT}$, and $8I_{UNIT}$. Because of the feature of thermometer code that it will be all zero above a point and all one below that point, this comparison will yield at least the most significant bit. The low order bits are then generated by subtracting the $kI_{IN}$ from the $cI_{UNIT}$ corresponding to the most significant "1" in the thermometer code generated by the previous comparison and recomparing. Any number in the range can be represented as $X=b_3 \times \frac{1}{2} + b_2 \times \frac{1}{4} + b_1 \times \frac{1}{8} + b_0 \times \frac{1}{16}$, where $b_3 b_2 b_1 b_0$ is the digital representations. In this example, if the dynamic range is 1 volt, $I_{UNIT}$ corresponds to $\frac{1}{16}$ volts, $2I_{UNIT}$ to $\frac{1}{8}$ volt, $4I_{UNIT}$ to $\frac{1}{4}$ volt, and $8I_{UNIT}$ to $\frac{1}{2}$ volt. Thus, taking for example a 0.55 V analog input, a first comparison yields a thermometer code of 1111. Accordingly, the most significant bit $b_3$ is "1." Subtracting 0.5 and reapplying the 0.05 to the same subrange yield the remaining bits equal "0." This is because 0.05 V<$\frac{1}{16}$ V, so the thermometer code for this comparison will be 0000. Accordingly, the four bit digital representation of 0.55 volts is 1000.

Taking a second example in which $V_{IN}$ is 0.71875. The generated thermometer code is 1111 since 0.71875 >.5; $b_3$ is equal to "1." Subtracting 0.5 from $V_{IN}$ yield 0.21875 which is the input to the next comparison. The resulting thermometer code is 0011 which indicates that $b_2$ is 0 and $b_1$ is 1 (because $\frac{1}{8}$<0.21875<$\frac{1}{4}$). Thus a third comparison is required, comparing 0.21875−$\frac{1}{8}$=0.09375. A thermometer code of 0001 results because $\frac{1}{16}$<0.09375 <$\frac{1}{8}$. Thus $b_0$ is 1 and the digital representation of 0.71875 is 1011.

In another embodiment, the invention is used as a multibit quantizer in a $\Sigma\delta$ A/D to permit the $\Sigma\delta$ A/D to operate at a lower sampling frequency.

As discussed above, high quality passive elements are not available in typical CMOS processing. The above embodiments do not require the resistor in the V to I converter to generate the scaled values. Therefore, it does not impact the accuracy of the A/D. In these embodiments, only current scaling is used. Accordingly, all the components of the A/D can be readily implemented using high speed digital CMOS fabrication techniques. This permits high speed sampling and reduces the cost of such implementations. Simulation reflects that sampling rates on the order of 600 megasamples per second (Ms/s) are attainable. Moreover, using this technique, six to ten bits of digital resolution are readily obtainable. This system is ideal for video applications which require a high sample rate (on the order of 100–200 Ms/s) and for which six to ten bits of resolution is plenty.

Figure 5:
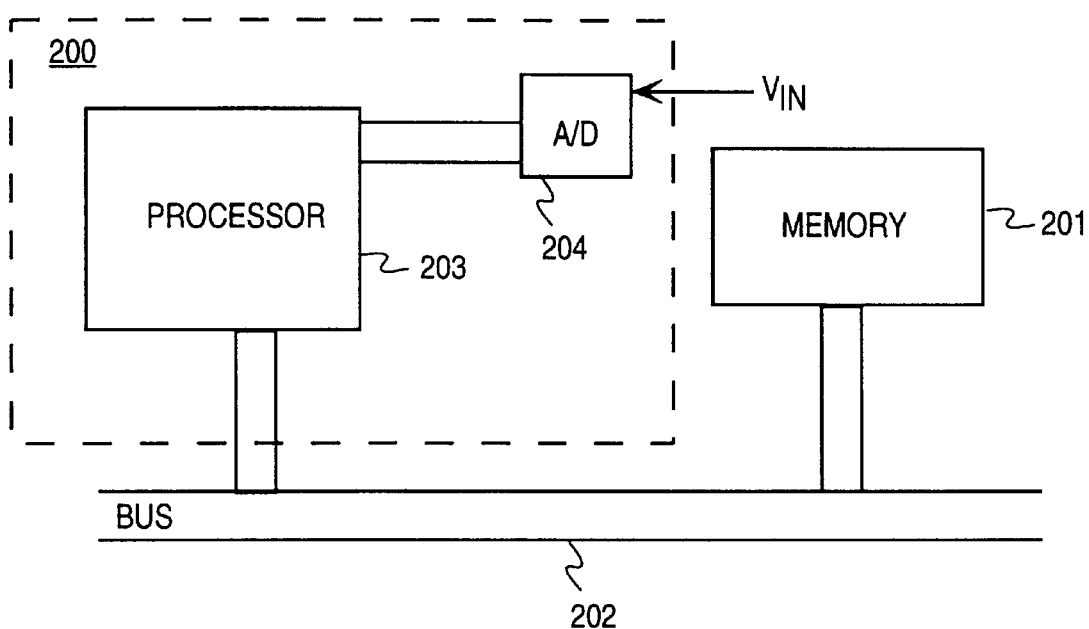
FIG. 5 is a block diagram of a system employing the A/D converter of one embodiment of the invention.

FIG. 5 is a system employing the A/D converter of one embodiment of the invention. A processor 203 is integrated with the A/D converter 204 onto a single chip 200. The processor is coupled to bus 202. A memory 201 is also coupled to the bus. An analog $V_{IN}$ drives the A/D converter 204 which may be of the form shown in FIG. 4 or any of the other described embodiments. The digital output of A/D converter 204 is suitable for processing in processor 203.

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. An A/D converter comprising:

a first voltage to current converter which generates an input current from an analog input voltage;

a current reference for generating first reference current;

a first plurality of scaling elements for generating a plurality of scaled reference currents;

a second plurality of scaling elements for generating a plurality of scaled input currents; and a plurality of current comparators which compare the scaled input currents to the scaled reference currents to generate a thermometer code.

2. The A/D converter of claim 1 wherein the current reference is a replicate of the first voltage to current converter.

3. The A/D converter of claim 1 wherein a resolution of at least six bits is obtained.

4. The A/D converter of claim 1 wherein the A/D converter is fabricated using a digital CMOS process.

5. The A/D converter of claim 4 wherein no characteristic passive elements are used.

6. A method of converting an analog signal to a digital signal comprising the steps of:

converting a voltage input to an input current;

creating a reference current and a plurality of multiples of the reference current;

comparing the input current to each of the reference current and the multiples of the reference current to generate a thermometer code; and converting the thermometer code to a digital value.

7. The method of claim 6 wherein the step of comparing compares the input current to all integer multiples of the reference current up to $2^N$ times the reference current wherein N is a number of bits of resolution of a digital output.

8. The method of claim 6 wherein the step of comparing comprises the steps of:

first comparing the input current to an upper limit of a subrange;

dividing the input current by a predetermined divisor if the comparing step indicates that the input current is greater than the upper limit of the subrange; and comparing one of the input currents and a divided input current, depending on the outcome of the first comparing step, to each multiple of the reference current within the subrange.

9. The method of claim 8 wherein the step of creating creates integer multiples of the reference current up to $2^{N+(1-X)}$ where N is a number of bits of resolution and X is a number of subranges.

* * * * *